United States Patent [19]

Tsunaga et al.

[11] Patent Number: 5,045,236

[45] Date of Patent: Sep. 3, 1991

[54] COPPER CONDUCTIVE COMPOSITION

[75] Inventors: Masayuki Tsunaga, Ina; Kazuaki Yuba, Ageo; Yoshiaki Kurimoto; Maraki Hirosawa, both of Takasaki, all of Japan

[73] Assignees: Mitsui Mining & Smelting Co., Tokyo; Gunei Chemical Industry Co., Ltd., Takasaki, both of Japan

[21] Appl. No.: 436,475

[22] Filed: Nov. 14, 1989

[30] Foreign Application Priority Data

Jun. 20, 1989 [JP] Japan .................................. 1-157184

[51] Int. Cl.$^5$ ............................................... H01B 1/06
[52] U.S. Cl. .................... 252/512; 252/514; 524/439; 524/440
[58] Field of Search ................ 252/514, 512; 524/439, 524/440

[56] References Cited

U.S. PATENT DOCUMENTS

| 3,202,488 | 8/1965 | Ehrreich et al. | 252/514 |
| 4,309,457 | 1/1985 | Kawasumi et al. | 427/216 |
| 4,996,005 | 2/1990 | Saito et al. | 252/512 |

Primary Examiner—Josephine Barr
Attorney, Agent, or Firm—Flynn, Thiel, Boutell & Tanis

[57] ABSTRACT

A copper conductive composition comprising 100 parts by weight of spherical copper powder coated with silver as metal powder, 6 to 18 parts by weight of resol type phenolic resin containing a dimethylene ether bond in bonded formaldehyde by 5% or more, the molar ratio between the formaldehyde thereof and phenol thereof (formaldehyde/phenol) being 1.0 to 3.0, 0.05 to 1 parts by weight of dispersant, and 2 to 15 parts by weight of solvent. Therefore, an excellent conductivity and solderability of the cured film can be obtained.

10 Claims, No Drawings

_5,045,236_

COPPER CONDUCTIVE COMPOSITION

BACKGROUND OF THE INVENTION (a) Field of the Invention

The present invention relates to a polymer type copper conductive composition for use in an electronic circuit, and more particularly to a copper conductive composition having both a satisfactory conductivity and an excellent solderability by employing spherical copper powder coated with silver as its metal powder and employing resol type phenolic resin containing a dimethylene ether bond in bonded formaldehyde by 5% or more as a binder.

(b) Description of the Prior Art

In general, a polymer type copper conductive composition for use in an electronic circuit or the like needs to have an excellent solderability for the purpose of readily conducting the soldering of wire lead or the like. A known copper conductive composition of the type having solderability is disclosed in Japanese Patent Laid-Open No. 64-34597. The composition as disclosed above consists of resol type phenolic resin, a saturated fatty acid, an unsaturated fatty acid, or their metal salt, a metal powder, a metal chelate forming agent, and a soldering agent. According to this invention, the metal chelate forming agent is added for the purpose of preventing the oxidation of the metal copper powder and an excellent solderability is obtained by adding the soldering agent.

However, it is necessary to add an antioxidant for the purpose of preventing the metal powder from oxidation and to add the soldering agent. Therefore, although an excellent solderability can be obtained, the conductivity is insufficient. On the contrary, another conventional type in which a satisfactory conductivity is realized suffers from its poor solderability. A composition that can exhibit both an excellent solderability with respect to cured films and satisfactory conductivity has not been as yet obtained. Therefore, it is necessary to individually use a composition exhibiting a satisfactory conductivity and another composition which exhibits an excellent solderability, or it is necessary to apply metal plating to a circuit on which a copper paste has been previously printed and cured.

The methods described above encounter a problem in that the manufacturing process is complex. In particular, the latter method suffers from another problem in terms of the disposal of waste liquid which raises the cost.

SUMMARY OF THE INVENTION

An object of the present invention is to provide a copper conductive composition capable of exhibiting both a satisfactory conductivity and an excellent solderability of the cured film.

According to the present invention, a copper conductive composition comprises:

100 parts by weight of spherical copper powder coated with silver as metal powder;

6 to 18 parts by weight of resol type phenolic resin containing a dimethylene ether bond in bonded formaldehyde by 5% or more, the molar ratio between the formaldehyde thereof and phenol thereof (formaldehyde/phenol) being 1.0 to 3.0;

0.05 to 1 parts by weight of dispersant; and 2 to 15 parts by weight of solvent.

DETAILED DESCRIPTION OF THE INVENTION

Then, the present invention will be described in detail.

Copper powder according to the present invention comprises spherical powder the average particle size of which is preferably 2 to 20 $\mu$m. If the average particle size is less than 2 $\mu$m, poor solderability of the cured film due to solder leaching occurs, on the contrary, if the same exceeds 20 $\mu$m, poor printability due to lodging of larger particles in mesh screens occurs when the paste is printed. Furthermore, a preferable average particle size is 5 to 10 $\mu$m. The thus-prepared spherical copper powder can be coated with silver by a so-called EDTA acidic bath method arranged such that the copper powder is dispersed in a solution in which a chelate forming agent has been dissolved, a silver ion solution is added to the former with stirring, and then a reducing agent is added. It is preferable to arrange the amount of the coating silver to be 0.5 to 5 wt % in the metal copper powder. If it is less than 0.5 wt %, the oxidation is excessively promoted, on the contrary, if the same exceeds 5 wt %, a problem of solder leaching and a problem of migration arise, with the cost being increased. Furthermore, the preferable amount of the coating silver is 1 to 3 wt %.

The resol type phenolic resin serving as the binder according to the present invention comprises a resin whose skeletal structure contains 5% or more dimethylene ether bonds in the bonded formaldehyde and the molar ratio between formaldehyde thereof and phenol thereof (formaldehyde/phenol) is 1.0 to 3.0. The term "bonded formaldehyde" represents formaldehyde bonded with phenol, it being exemplified by: methylol ($-CH_2OH$), methylene ($-CH_2-$), dimethylene ether ($-CH_2OCH_2-$), hemiacetal ($-(CH_2O)n-H$), and the like. The above-described amount of bond of dimethylene ether in the bonded formaldehyde is calculated provided that the amount of the latter is 100. If the dimethylene ether bond is contained by 5% or more, the solubility of the phenolic resin in rosin flux can be improved, thus, solderability can be improved, and also flexibility and adhesion are improved. On the other hand, if the same is less than 5%, the solubility in the rosin flux becomes insufficient, so the solderability deteriorates. Also flexibility and adhesion deteriorate. Furthermore, a preferable amount of bond of dimethylene ether is 15 to 30%. If the molar ratio between formaldehyde and phenol exceeds 3.0, the deterioration of film toughness and undercuring occurs owing to the decrease of molecular weight, while if the same becomes less than 1.0, the crosslinking density is lowered, and as well the amount of content of the dimethylene ether bond decreases. Furthermore, a preferable molar ratio is 1.5 to 2.5. The above-described binders are added by 6 to 18 parts by weight with respect to 100 parts by weight of the spherical copper powder coated with silver. If the binder is less than 6 parts by weight, the conductivity, the tensile strength of the cured film, and the adhesion to the substrate become insufficient, on the other hand, if the same exceeds 18 parts by weight, the solderability and the conductivity become defective.

As the dispersant, organic titanate compounds comprising an organic compound in which a hydrophilic group and a lipophilic group are bonded to the central element—titanium— is preferably employed, this organic compound being called "titanate coupling agents". The titanate coupling agent is classified into following four types on the basis of the difference in the hydrophilic group thereof:

a monoalkoxy type (that having an isopropoxy group);

a chelate type (that having an oxyacetate residue);

another chelate type (that having an ethylene glycol residue); and a coordinate type (that prepared by adding phosphorous ester to tetraalkyl titanate).

The monoalkoxy type dispersant can exhibit the most sufficient effect among the above-described titanate coupling agents. This type of organic titanate compound is coordinated or adsorbed on the surface of the copper powder coated with silver so that the dispersibility into the binder at the time of performing the kneading is improved. In particular, the above-described type of improvement becomes significant according to the present invention in which the copper powder content is arranged to be high. In order to obtain a cured film exhibiting an excellent solderability, it is, of course, necessary for a great amount of the copper powder coated with silver to be present on the surface of the cured film, and also it is necessary for the same to be distributed uniformly. Therefore, when a cured film is formed by using paste whose dispersibility is improved by containing the organic titanate compound, an excellent solderability can be obtained. The dispersant is added by an amount of 0.05 to 1 parts by weight with respect to 100 parts of the copper powder coated with silver. If the amount of the dispersant is less than 0.05 parts by weight, the solderability becomes defective. On the contrary, if the same exceeds 1 parts by weight, the adhesion to the substrate deteriorates.

It is preferable that polyhydric alcohol derivatives exemplified as follows are employed: butyl cellosolve; dibutyl cellosolve; methyl carbitol; ethyl carbitol, butyl carbitol, dibutyl carbitol; butyl cellosolve acetate; methyl carbitol acetate; ethyl carbitol acetate; butyl carbitol acetate and so on. These polyhydric alcohol derivatives are capable of serving as a preferred solvent for the resol type phenolic resin, and as well capable of preventing volatilization of the solvent at the time of performing the printing. In addition, the amount of residue in the film can be reduced after the curing. The solvent is added by 2 to 15 parts by weight with respect to 100 parts by weight of the spherical copper powder coated with silver. If it is less than 2 parts by weight, blur is generated at the screen printing, on the other hand, if it exceeds 15 parts by weight, bleeding is generated and also conductivity and solderability become defective.

In addition to the above, an anti-foaming agent, leveling agent, and thixotropic agent may, of course, be added.

The thus-prepared composition is applied by a screen printing or the like in accordance with the conventional method before being so heated as to be cured so that the thus-cured composition is put into practical use.

According to the present invention, since the spherical copper powder coated with silver is employed as the metal powder, the following operation is displayed.

That is, in general, prevention of oxidation of the cured film of the copper conductive composition, for which a soldering capability is not required, is achieved by using a reducing agent or the like. When the soldering capability is required in the copper conductive composition, metal copper powder is, at a large proportion, loaded in the cured film so as to be present in the film surface as much as possible. Therefore, the metal copper powder can be readily oxidized, causing the usual reducing agent to act insufficiently. However, according to the present invention, since the surface of the copper powder is covered with a slight quantity of silver, any oxidation can be prevented even if the copper powder is present in the cured film in a large quantity. Therefore, both a satisfactory conductivity and excellent solderability can be obtained. In order to serve as the conductive copper paste, dendritic copper powder is usually employed. However in this case, the amount of binder in the paste is necessarily larger on the surface of the cured film compared with the boundary with the printed substrate. Therefore, the binder deteriorates the solderability. However, according to the present invention using the spherical copper powder, the binder in the paste can be moved, by a considerable amount, to the boundary with the substrate after the printing until the intermediate stage of the curing process with a slight quantity of the binder left on the surface of the cured film. Therefore, the thickness of the binder on the spherical copper powder which exists on the surface of the cured film can be significantly reduced compared with that on the dendritic copper powder, this binder being readily removed by the dissolving action of the flux. In addition, by employing spherical copper powder, the following two effects can be obtained:

i) Since particles can move smoothly with one another, paste exhibiting excellent printability can be obtained even if a considerably large quantity is contained.

ii) Since the specific surface area of copper power can be reduced, the amount of silver needed to effectively cover the surface can be reduced.

According to the present invention, since resol type phenolic resin containing 5% or more of dimethylene ether bonds in the bonded formaldehyde is employed as the binder, a thin binder layer formed on the surface of the above-described copper powder coated with silver can be dissolved by the flux when a high temperature soldering is conducted. As a result, clean surface of the copper powder coated with silver is allowed to appear, and an excellent solderability can be obtained.

As described above, according to the present invention, a copper conductive composition exhibiting a satisfactory conductivity and excellent solderability, improved printing performance, and sufficient adhesion strength can be obtained.

DESCRIPTION OF THE PREFERRED EMBODIMENTS

Then, embodiments of the present invention will be described.

The composition was made as shown in Table 1. The thus-obtained composition was kneaded by a three-roll mill so as to prepare compositions according to this embodiment and comparative examples 1 to 8. The thus-obtained compositions were printed on a paper phenolic substrate (1.6 mm in thickness) by a 200-mesh tetron screen before being heated at 160° C. for 30 minutes in an air oven so as to be cured.

Then, the thus-obtained cured compositions were subjected to the solderability test, specific resistance test, adhesive strength test, and printability test. The results are also shown in Table 1.

Then, a method of each test will be described.

(1) Solderability test

A print pattern of 2 mm × 2 mm is used.

Flux #366 (manufactured by Multicore Solders Inc.) is applied to the surface of the sample before preheating at 150° C. for 20 seconds. Then, the test sample is dipped in 230° C. eutectic solder bath for 3 seconds. The solder coverage on the pattern after dipping is evaluated as follows:

○: solder coverage 100%
Δ: solder coverage 80 to 99%
x: solder coverage 79% or less (2) Specific resistance A print pattern of 1 mm × 200 mm is used.

The electric resistance R (Ω) and the average film thickness t (μm) are measured so as to calculate a specific resistance ρ (Ω·cm) by the following equation.

$$\rho = \frac{R \times t}{200} \times 10^{-4}$$

(3) Adhesive strength

A print pattern of 2 mm × 2 mm is used.

The sample obtained from the solderability test is used directly, a 0.8 mm φ tin plated soft copper wire is attached to the central portion of the print pattern of 2 mm × 2 mm, and it is soldered with a solder wire and a soldering iron. Then, a 90°-pull test is conducted with a tensile tester so as to measure the breaking load F (kg). Then, an adhesive strength T (kg/mm²) is obtained.

$$T = F/4$$

(4) Printability test

A pattern in which 10 lines of 0.2 mm × 10 mm are arranged in parallel at intervals of 0.2 mm is used. Bleedings of the paste between the lines are observed by a microscope so that the printability is evaluated as follows:

○: the degree of bleedings of paste between the lines are not considerable and are not connected to one another x: the degree of bleedings of paste between the lines is excessive and are connected to one another

TABLE 1

| | Unit: parts by weight | | | | | | | | |
|---|---|---|---|---|---|---|---|---|---|
| | Embodiment | Comparative Example 1 | Comparative Example 2 | Comparative Example 3 | Comparative Example 4 | Comparative Example 5 | Comparative Example 6 | Comparative Example 7 | Comparative Example 8 |
| Silver Coated Copper Powder A (Ag 2 wt %, 10 μm. spherical copper powder) | 100 | 100 | 100 | 100 | 100 | — | — | 100 | 100 |
| Silver Coated Copper Powder B (Ag 2 wt %, 5 μm dendritic copper powder) | — | — | — | — | — | 100 | — | — | — |
| Copper Powder C (10 μm spherical copper powder) | — | — | — | — | — | — | 100 | — | — |
| Resol Type Phenolic Resin D (GM-1 (Gun Ei Chemical Ind. Co. Ltd.)) | 10 | 5 | 20 | — | — | 10 | 10 | 10 | 10 |
| Resol Type Phenolic Resin E (GM-2 (Gun Ei Chemical Ind. Co. Ltd.)) | — | — | — | 10 | — | — | — | — | — |
| Epoxy Resin** (Epikote 828 (Shell Chemical Co.)) | — | — | — | — | 10 | — | — | — | — |
| Organic Titanate Compound (KR-TIS (Ajinomoto Co., Inc.)) | 0.1 | 0.1 | 0.1 | 0.1 | 0.1 | 0.1 | 0.1 | — | 0.1 |
| Solvent (Methyl Carbitol) | 7 | 7 | 7 | 7 | 7 | 7 | 7 | 7 | 16 |
| Solderability | ○ | ○ | Δ | X | X | Δ | X | Δ | Δ |
| Specific Resistance (× $10^{-4}$ Ω·cm) | 1.8 | 4.2 | 3.7 | 2.0 | $>10^4$ | 3.2 | $>10^4$ | 3.3 | 2.9 |
| Adhesive Strength (kg/mm²) | 1.5 | 0.4 | 1.5 | —* | —* | 1.2 | —* | 1.2 | 1.3 |
| Printability | ○ | ○ | ○ | ○ | X | ○ | ○ | ○ | X |

GM-1: Resol type phenolic resin containing 20% or more of dimethylene ether bond in bonded formaldehyde
GM-2: Resol type phenolic resin containing 1% or less of dimethylene ether bond in bonded formaldehyde
Where
*was not measured since the film surface was not covered with solder.
**10 wt % of benzyl dimethyl amine is contained as curing agent.

From Table 1, the following facts are clearly shown.

Composition according to this embodiment

As the metal powder, spherical copper powder coated with 2 wt % silver the average particle size of which is 10 μm is used. As the binder, resol type phenolic resin containing the dimethylene ether bond by 20% or more is used. As the dispersant, organic titanate compound is used. As the solvent, methyl carbitol is mixed. Furthermore, the above-described components are mixed at a proper proportion. Therefore, excellent solderability and printability can be obtained, and the specific resistance can be reduced and a great adhesive strength is obtained.

Composition according to comparative example 1

Although a proper resol type phenolic resin is used as the binder, the amount of mixture of it is lower than the lower limit. Therefore, the specific resistance cannot be reduced, and the adhesive strength becomes insufficient.

Composition according to comparative example 2

Although a proper resol type phenolic resin is used as the binder, the amount of mixture of its exceeds the upper limit. Therefore, the solderability becomes insufficient, and the specific resistance cannot be reduced.

Composition according to comparative example 3

Since resol type phenolic resin whose dimethylene ether bond is less than 1% is used as the binder, solderability is completely poor.

Composition according to comparative example 4

Since epoxy resin is used as the binder, solderability is completely poor.

Composition according to comparative example 5

Since electrolytic (dendritic) copper powder coated with silver is used as the metal powder, solderability is insufficient, and the specific resistance cannot be reduced.

Composition according to comparative example 6

Since copper powder which is not coated with silver is used as the metal powder, solderability is completely poor, and an excessive specific resistance is obtained.

Composition according to comparative example 7

Since no organic titanate compound is added, the solderability is insufficient, and the specific resistance cannot be reduced.

Composition according to comparative example 8

Since the amount of solvent is added by a large level, the solderability becomes defective, and the specific resistance cannot be reduced.

What is claimed is:

1. A copper conductive composition comprising:
   100 parts by weight of spherical copper powder coated with silver, the average particle size of said spherical copper powder being from 2 to 20 μm and the amount of the silver coating being from 0.5 to 5 wt %, based on said spherical copper powder;
   6 to 18 parts by weight of resol phenolic resin containing 5% or more of dimethylene ether bonds in the bonded formaldehyde, the molar ratio of formaldehyde to phenol (formaldehyde/phenol) in said phenolic resin being from 1.0 to 3.0;
   0.05 to 1 parts by weight of dispersant; and
   2 to 15 parts by weight of solvent.

2. A copper conductive composition according to claim 1, wherein the average particle size of said spherical copper powder is 5 to 10 μm.

3. A copper conductive composition according to claim 1, wherein the amount of the silver coating is 1 to 3, based on metal copper powder.

4. A copper conductive composition according to claim 1, wherein said resol phenolic resin contains 15 to 30% of dimethylene ether bonds in said bonded formaldehyde.

5. A copper conductive composition according to claim 1, wherein the molar ratio of formaldehyde to phenol in said resol phenolic resin is from 1.5 to 2.5.

6. A copper conductive composition according to claim 1, wherein said dispersant comprises an organic titanate compound.

7. A copper conductive composition according to claim 1, wherein said solvent comprises a polyhydric alcohol derivative.

8. A copper conductive composition according to claim 1, containing one or more of an anti-foaming agent, a leveling agent, and a thixotropic agent.

9. A copper conductive composition according to claim 1, wherein said metal copper powder is coated with silver by an EDTA acidic bath method.

10. A copper conductive composition according to claim 5, wherein said metal copper powder is coated with silver by an EDTA acidic bath method.

* * * * *

UNITED STATES PATENT AND TRADEMARK OFFICE
CERTIFICATE OF CORRECTION

PATENT NO. : 5 045 236
DATED : September 3, 1991
INVENTOR(S) : Masayuki TSUNAGA et al It is certified that error appears in the above-identified patent and that said Letters Patent is hereby corrected as shown below:

On the title page at item [75] change the first name of the fourth inventor from "Maraki" to ---Masaki---.

On the title page at item [73] change the name of the first assignee to ---Mitsui Mining & Smelting Co., Ltd.---.

Column 8, line 11; change "3," to ---3 wt.%,---.

Column 8, line 13; change "50" to ---to---.

Signed and Sealed this

Twelfth Day of January, 1993

Attest:

DOUGLAS B. COMER

*Attesting Officer*    Acting Commissioner of Patents and Trademarks